(12) United States Patent  
Dickson et al.

(10) Patent No.: US 8,166,446 B2
(45) Date of Patent: Apr. 24, 2012

(54) FLEXIBLE TEST FIXTURE

(75) Inventors: Mark A. Dickson, Lutz, FL (US);
Edward J. Collins, Tampa, FL (US);
Robert Gregory Jukna, Pinelass Park, FL (US)

(73) Assignee: Jabil Circuit, Inc., St. Petersburg, FL (US)

( * ) Notice: Subject to any disclaimer, the term of this patent is extended or adjusted under 35 U.S.C. 154(b) by 952 days.

(21) Appl. No.: 12/173,463

(22) Filed: Jul. 15, 2008

(65) Prior Publication Data

US 2009/0072849 A1 Mar. 19, 2009

Related U.S. Application Data

(60) Provisional application No. 60/972,102, filed on Sep. 13, 2007.

(51) Int. Cl.
*G06F 11/22* (2006.01)
*G06F 17/50* (2006.01)
*H05K 7/20* (2006.01)
*H05K 1/00* (2006.01)
*H05K 1/18* (2006.01)
*H05K 7/00* (2006.01)

(52) U.S. Cl. ........ 716/136; 716/137; 361/719; 361/720; 361/748; 361/749

(58) Field of Classification Search .................. 716/136, 716/137; 361/719, 720, 748, 749
See application file for complete search history.

(56) References Cited

U.S. PATENT DOCUMENTS

| | | | |
|---|---|---|---|
| 4,833,402 A * | 5/1989 | Boegh-Petersen | 324/755.08 |
| 5,450,017 A | 9/1995 | Swart | |
| 5,506,510 A | 4/1996 | Blumenau | |
| 5,898,314 A | 4/1999 | Swart | |
| 6,828,773 B2 | 12/2004 | Buczkowski et al. | |
| 7,098,679 B2 | 8/2006 | Dick et al. | |
| 2002/0093355 A1 * | 7/2002 | Parker et al. | 324/761 |

* cited by examiner

*Primary Examiner* — Suresh Memula
(74) *Attorney, Agent, or Firm* — Price Heneveld LLP

(57) ABSTRACT

A system for testing an electronic circuit board (ECB) having a plurality of test points in a pre-defined arrangement on a measurement device having a plurality of resources includes an interface fixture having a plurality of contact pads arranged in an array on a first surface. The contact pads can be electrically coupled to the plurality of resources of the measurement system according to a pre-defined pattern, where at least two of the contact pads are electrically coupled to one of the plurality of resources in a many-to-one relationship. The system also includes a test fixture removably attached to the first surface of the interface fixture. The test fixture includes an upper probe plate having a plurality of openings and a lower probe plate parallel to the upper probe plate. The lower probe plate includes a plurality of openings associated with the openings in the upper probe plate. The test fixture also includes a plurality of probes extending through the associated openings in the upper and the lower probe plates, contacting one of the contact pads, and guided to test points of the ECB by the associated openings.

8 Claims, 13 Drawing Sheets

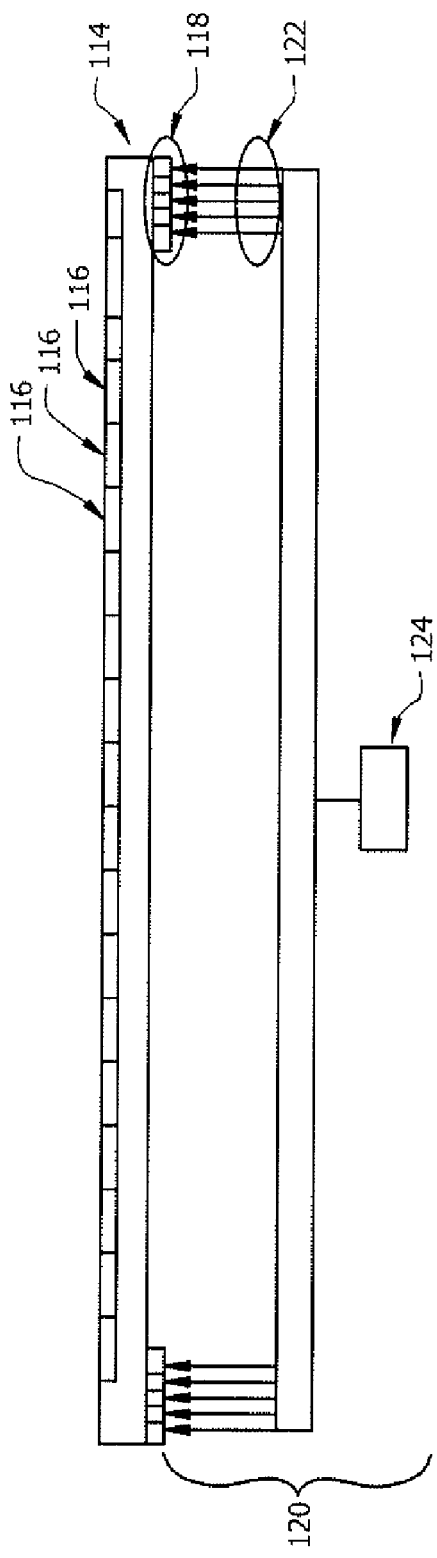
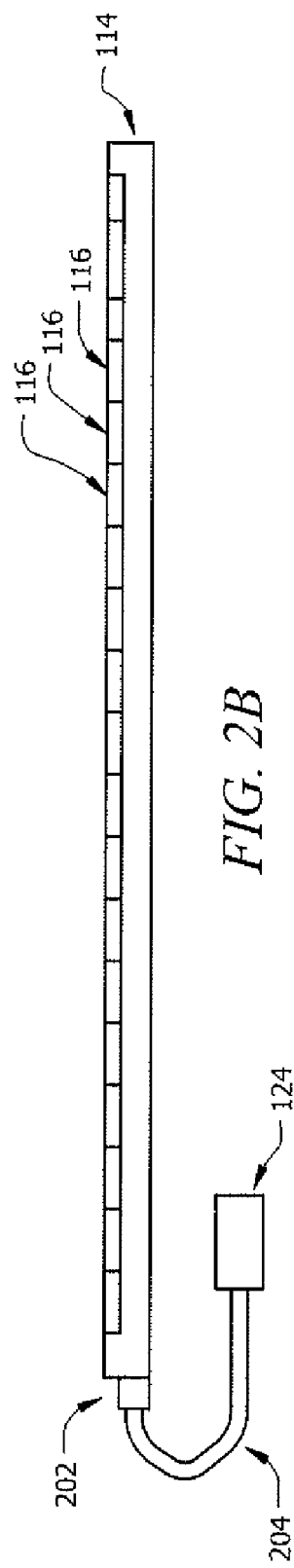
FIG. 2A
FIG. 2B

FLEXIBLE TEST FIXTURE

CROSS REFERENCE TO RELATED APPLICATIONS

The present application claims the priority of U.S. provisional patent application Ser. No. 60/972,102 filed Sep. 13, 2007, entitled "Flexible Test Fixture" and is incorporated herein in its entirety.

FIELD OF THE INVENTION

The present invention is directed to the field of testing electronic devices using test fixtures, and more particular to test fixture systems and designs.

BACKGROUND

The complexity of printed circuit boards (PCBs) is constantly increasing due to new packaging technologies including higher density designs. Consequently, many PCBs now have less space available for electrical test points and are produced with less than complete electrical test access. However, electronic device development still requires the ability to design and test preproduction prototypes of the PCBs. In general, these PCBs are electrically tested using a bed-of-nails style customized test system or a flying probe tester to directly contact electrical traces on the PCB. However, the costs for such customized test fixtures are prohibitively high if only a limited production run of PCBs is to be manufactured. Flying probe testers include a repositionable electrical probe that is adaptable to any PCB design, but provides a lower throughput when switching between multiple types of PCBs or performing different types of tests.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

In a first embodiment of the present invention, a system for testing an electronic circuit board (ECB) on a measurement device having a plurality of resources is provided. The ECB can have a plurality of test points in a pre-defined arrangement. The system can include an interface fixture having a plurality of contact pads arranged in an array on a first surface, the contact pads being electrically coupled to the plurality of resources of the measurement system according to a pre-defined pattern. In the interface fixture at least two of the contact pads are electrically coupled to one of the plurality of resources in a many-to-one relationship. The system can also include a test fixture removably attached to the first surface of the interface fixture. The test fixture can include an upper probe plate having a plurality of openings, and a lower probe plate parallel to the upper probe plate, where the lower probe plate has a plurality of openings associated with the openings in the upper probe plate, and a plurality of probes. In the test fixture, each of the probes extends through one of the associated openings in the upper and the lower probe plates and contacts one of the contact pads. Each of the associated openings can also guide each of the probes to one of the test points of the ECB.

In a second embodiment of the present invention, a method for utilizing a common measurement system for testing a plurality of electronic circuit boards (ECB) having different patterns of test points is provided. The method can include selecting an interface fixture to include an array of conductive contact pad regions on a first surface and providing a measurement system having a plurality of nodes coupled to said contact pad regions, where each of the plurality of nodes is electrically coupled to a plurality of the contact pads regions. The method can further include identifying a pattern of a plurality of test points on an ECB from which a set of measurement data is to be acquired and defining a plurality of paths for a plurality of probes in a test fixture removably to the interface fixture to connect the conductive contact pad regions to the plurality of test points. In the method, each of the paths is selected to align one of the plurality of probes, at least partially, with one of the test points of the ECB.

In a third embodiment of the present invention, a method for designing a test fixture including at least one deformable probe for testing an electronic circuit board (ECB) on a measurement system having a plurality of resources is provided. The ECB having a plurality of test points in a pre-defined arrangement. The method can include the step of overlaying a first map of locations of the plurality of test points on the ECB and a second map of the contact pads electrically coupled to the plurality of resources of the measurement system according to a pre-defined pattern. In the method, at least two of the contact pads are electrically coupled to one of the plurality of resources in a many-to-one arrangement.

The method can also include the step of adjusting an alignment of the first and the second maps to increase a first number of the locations in the first map within a unique one of the contact pads in the second map and defining within the second map a plurality of contact points within the contact pads in the second map, each of the contact points associated with each of the locations in the first map. The method can further include altering at least one among a position of one or more of the contact points in the second map and the alignment of the first map and the second map to increase a second number of the contact points in the second map associated unique ones of the resources. The method can also include generating a design for the plurality of probe plates based on the position of the contact points and the alignment of the first and the second maps. In the method, the design specifies a pattern of openings for at least an upper probe plate and a lower probe plate of the test fixture, where each of the openings in the lower probe plate is associated with each of the openings in the upper probe plate, and where at least one of the openings in the lower probe plate is laterally offset with respect to the associated one of the openings in the upper probe plate. The lateral offset can be at least 0.001 inches and less than or equal to a lateral probe deflection (LPD) distance based on a maximum lateral deflection of the deformable probe.

BRIEF DESCRIPTION OF THE DRAWINGS

FIG. 2 shows alternative configurations for an interface fixture according to the various embodiments of the present invention.

DETAILED DESCRIPTION

Figure 1:
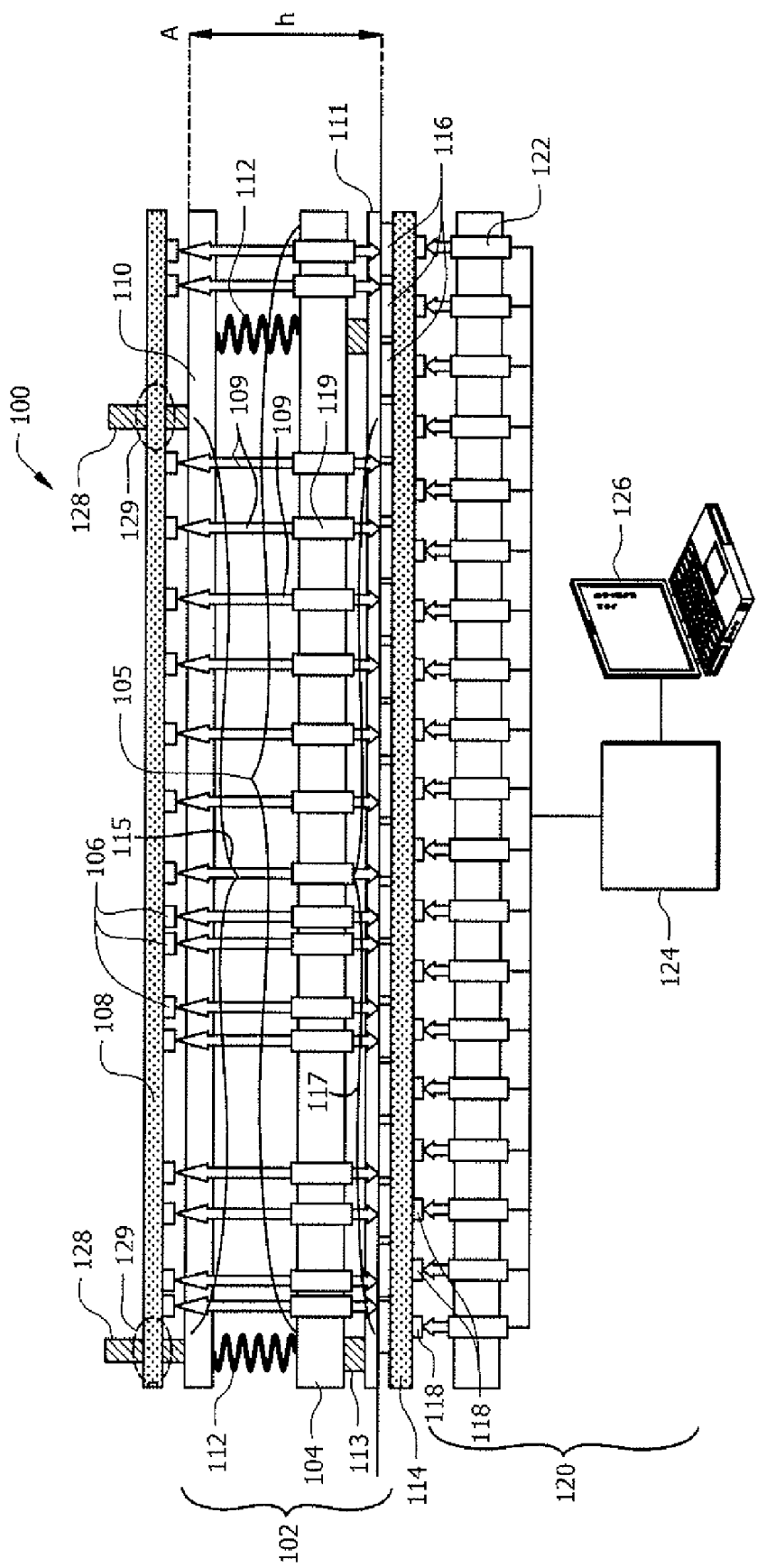
FIG. 1 shows cross-section view of an exemplary test system according to an embodiment of the present invention.
Figure 3A:
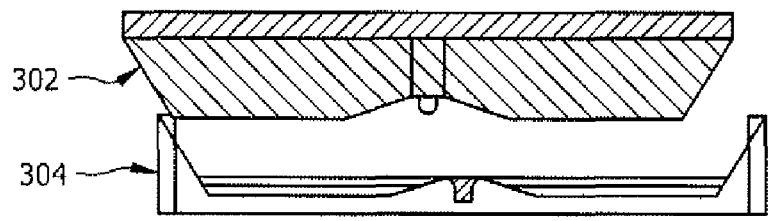
FIG. 3 shows an exemplary sequence for a mated test and interface fixtures according to an embodiment of the present invention.
Figure 3B:
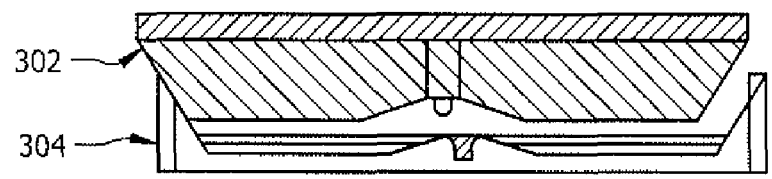
Figure 3C:
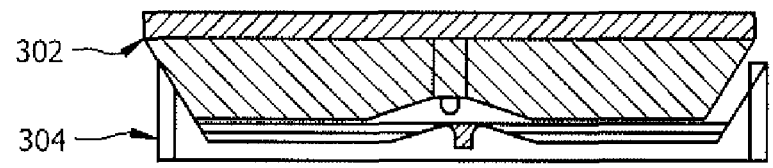
Figure 3D:
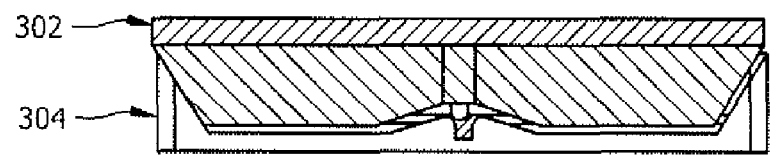
Figure 3E:
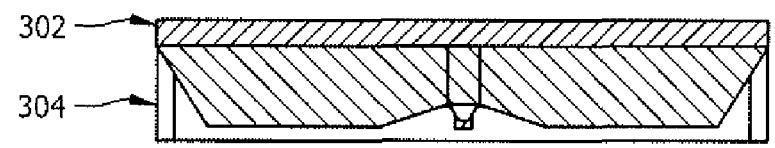

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention. The present invention may be embodied in many different forms and should not be construed as limited to the embodiments set forth herein. For example, the present invention can be embodied as a method, a system, or a computer program product. Accordingly, the present invention can take form as an entirely hardware embodiment, an entirely software embodiment or a hardware/software embodiment.

Embodiments of the present invention comprise systems and methods for testing electronic devices. In the various embodiments of the present invention, electronic devices, such as electronics circuit boards (ECBs), can be tested with testing system. The testing system can include a test fixture for contacting the ECB and configured to interface with a standardized electronic device measurement system. An "electronics circuit board", as used herein, refers to any type of substrate having on or therein interconnected electronic circuit components. By way of example, not by way of limitation, substrates for ECBs can include flexible or rigid printed circuit or wired boards, stripboards, perfboards, and breadboards. In particular, embodiments of the present invention provide a test system including an interface fixture configured to mechanically couple a customized test fixture to a standardized measurement system. The mechanical coupling also electrically couples probes on the test fixture to the measurement system. The mechanical coupling design for the test fixture permits the customized test fixture to be exchanged to support testing of multiple products without any specialized rewiring. Therefore, the need for costly and complex testing systems is reduced or eliminated.

FIG. 1 shows an exemplary device testing system 100 arranged according to an embodiment of the present invention. The testing system 100 includes two parts. The first part is an interface fixture 114, described below. The second part is a customized and removable test fixture 102 having a plurality of electrically conductive probes 109. In the various embodiments, at least one end of each of the probes 109 is flexible to permit deflection or bending of these ends of the probes 109. The probes are disposed through a plurality of probe plates 104, 110, 111 in the test fixture 102, each with a drill pattern of openings 105, 115, 117. Each of the drill patterns matches or substantially matches a pattern of test points 106 on the ECB 108 being tested. That is, the centers of the openings 105 are within a maximum deflection distance from the centers of the test points 106 on the ECB 108, as described below. Furthermore, each of openings 105, 115, and 117 are associated with test points 106 on the ECB 108. Although FIG. 1 shows the openings 105, 115, 117 all being aligned along a vertical axis, the invention is not limited in this regard, as described below. In the various embodiments, the probe plates 104, 110, 111 can be constructed from any electrically insulating material, including fiberglass materials, laminates, ceramics, or plastics.

As described above, the test fixture 102 includes electrically conductive probes 109. In the various embodiments of the present invention, the probes 109 are inserted through associated ones of openings 105, 115, 117 in each of the of the probe plates 104, 110, 111. In operation, the probes 109 are used for electrically and mechanically contacting the ECB 108 at the test points 106 and an interface fixture 114. Accordingly, the probes 109 are dual tipped. In some embodiments the probes 109 can also include a spring mechanism for one or both ends of the probes 109. One of ordinary skill in the art will recognize that the length of the probes 109 can be specified such that upon proper positioning of the ECB 108 on the test fixture 102 of a particular height (h), each of the probes 109 contacts one of the test points 106.

As previously described, the test fixture 102 can be designed to have the openings 105, 115, and 117 aligned along a vertical axis that is centered on the position of the test points 106 of the ECB 108. However, exact centering of the openings 105, 115, and 117 with respect to the test points 106 is not required for properly testing the ECB 108. Rather, the amount of precision in the alignment of the drill pattern of openings 105, 115, and 117 and the test points 106 can vary according to the position and the contact areas of the test points 105 and the contact area of the contacting end of the probes 109. Accordingly, as the size of these contact areas increase, the amount of acceptable misalignment between the openings 105, 115, and 117 and the test point 108 is greater. One of ordinary skill in the art will also recognize that centering precision requirements can be alleviated by varying probe tip design. Accordingly, sharpened, rounded, or other probe tip designs can be used with the various embodiments of the invention.

In the various embodiments of the present invention, the fixture 102 includes an upper probe plate 110 and a lower probe plate 111 separate by approximately a height h, the height of the probes. However, in other embodiments of the present invention, a plug probe plate 104 can also be included. In such embodiments, the plug probe plate 104 can be used advantageously with probes 109 having spring-loaded ends, flexible ends, or any combination thereof. For example, the plug probe plate 104 can be used to affix a position of central portion or barrel 119 of the probes 109. That is, at least a portion of the barrel 119 is disposed and affixed in one of openings 105. Accordingly, the position of the ends of the probes 109 can be changed relative to the positions of openings 105 and the barrels 119 of the probes 109.

Regardless of the number of probe plates 104, 110, 111 being used, they can be separated and connected by one or more spacers, including deformable spacers, rigid spacers, or any combination thereof. For example, as shown in FIG. 1, springs 112 are used as spacers between the upper probe plate 110 and the plug probe plate 104. The springs 112 not only ensure that plug probe plate 104 and the upper probe plate 110 are kept separated by at least a minimum distance, but can also be configured to support and protect the contacting ends of the probes. For example, the springs 112 and the upper probe plate 110 can be configured so that the contacting ends of the probes 109 are not exposed unless a minimum force is placed upon the upper probe plate 110. For example, such a force can be less than of equal to the weight of the ECB 108 being tested. Alternatively, a force greater that a weight of the ECB 108 can be required. This arrangement prevents the ends of the probes 109 from being exposed prior to deliberate testing of the ECB 108. Additionally, in cases where deformable spacers, such as springs 112, are used, the guide plate can be further configured to allow only a predetermined portion of the contacting ends of the probes 109 to be exposed in response to a weight.

FIG. 1 also shows that rigid spacers 113 are used as spacers between the lower probe plate 111 and the plug probe plate 104. However, the invention is not limited to the configuration of spacers shown in FIG. 1. In the various embodiments of the present invention, deformable spacers could also be used between the lower probe plate 111 and the plug probe plate 104 to provide the same functionality as described above for the springs 112. Similarly, rigid spacers can also be used between the upper probe plate 110 and the plug probe plate 104.

In yet other embodiments, only rigid spacers can be used to separate the probe plates 104, 110, and 111. In such embodiments, in order to protect the exposed ends of the probes 109, deformable spacers can be placed on outer surfaces of the test fixture 102, such as on an exposed surface of the upper probe plate 110. In such embodiments, deformable spacers, such as springs, can be used to support the ECB 108 to test above the ends of the probes 109. Accordingly, as described above, the ECB 108 will only contact the probes 109 when a minimum force is placed on the ECB 108 and the spacers. For example, a force greater that a weight of the ECB 108 can be required. This arrangement prevents the ends of the probes 109 from being exposed prior to deliberate testing of the ECB 108.

The second part of the test device 100 is an interface fixture 114. The interface fixture 114 can include an array of electrically conductive contact pads 116 on an upper surface. As shown in the exemplary embodiment in FIG. 1, these contact pads 116 can be electrically coupled to a pre-determined arrangement of electrical contact points 118 on a lower surface. The interface fixture 114 is then electrically coupled to a measurement system 120. In embodiments with an interface fixture 114 having contact points 118, the interface fixture 114 can be electrically connected to the measurement system via a plurality probes or nodes 122 connected to the measurement system 120 and arranged to match the pre-determined arrangement of contact points 118 of the interface fixture 114. The measurement system 120 can also include a circuit testing system 124 for collecting and/or generating signals for each of the contact pads in the interface fixture. The measurement system 120 can further include a user interface 126 for monitoring and/or directing operation of circuit testing system 124. Although FIG. 1 shows the interface fixture 114 and the testing system 120 as separate components, one of ordinary skill in the art will recognize that they can be combined into a single system.

However, the invention is not limited to electrically coupling the interface fixture 114 and the circuit testing system 124 using a measurement system having the regular arrangement of contact points 118 shown in FIG. 1. For example, as shown in FIG. 2A, the contact points of the interface fixture 114 can be arranged along one or more edges of the interface fixture 114. In yet other embodiments, a circuit testing system may not include any contact points. Rather as shown in FIG. 2B, the measurement system 124 of the circuit testing system can be coupled to the interface fixture using a connector interface 202 providing pinouts to the various contact pads 112 in the interface fixture 114. A connector 204 can then be used to electrically connect the contact pads 116 to the measurement system 124. By way of example, and not by way of limitation, a connector 204 can include ribbon cables, wires, or other electrical conductors having a common connector end for interfacing with the connector interface 202. Accordingly, in the various embodiments of the present invention, different interface fixtures can be fabricated for different test tools, allowing the test fixture to be used with different measurement systems, increasing testing flexibility. For example, different test tools can be configured for different tests and the test fixture and the ECB can be moved from test tool to test tool to perform the different tests. In such embodiments, the contact pads of the different interface fixtures would be identically arranged, however the contact pads may be connected to different types of measurement systems and different sets of resources in such measurement systems.

After the interface fixture 114 is electrically connected to the measurement system 120, the test fixture 102 is positioned on top of the interface fixture 114 such that the end of the probes 109 emerging from the lower probe plate 111 are in contact with the array of contact pads 116, as shown in FIG. 1. In the various embodiments of the present invention, the alignment and position of the test fixture 102 and the interface fixture 114 can be secured by using one or more fasteners, such as screws or clips. The ECB 108 can then be placed on the upper probe plate 110 to begin testing.

In some embodiments, a shape of the various surfaces of the interface 114 and the test fixture 102 can be configured to allow the test fixture to be positioned in only one manner. This is conceptually illustrated by the sequence (a)-(e) in FIG. 3. As shown in FIG. 3, the bottom surface of the test fixture 302 can have surfaces designed to mate with surfaces of the interface fixture 304. Accordingly, regardless of how the test fixture 302 is initially positioned, with respect to the interface fixture 304, the surfaces guide the interface fixture to the proper position, as shown in (e). One of ordinary skill in art will recognize that the arrangement in FIG. 3 is presented by way of example and not limitation. In the various embodiments, any number of surfaces of the interface fixture and the test fixture can be arranged to mate. For example, the perimeter of one or more of probe plates 104, 110, and 111 can have a shape that is designed to mate with surfaces of the interface fixture.

As previously described, one aspect of the present invention is to provide a test fixture customized for a particular ECB. That is, referring back to FIG. 1, the arrangement of openings 105, 115, and 117 in the probe plates 104, 110, and 111 can be unique for each ECB 108 being tested. Furthermore, the alignment (lateral and/or rotation alignment) for each ECB 108 can also be unique. That is, the position of the ECB 108 with respect to the position of the test fixture, the interface fixture 114, and the measurement system 120 can be unique, as described below. Additionally, where an ECB 108 is undergoing different sets of testing, a different test fixture 102 with a different drill pattern of openings 105 can be provided for each set of tests. However, the invention is not limited in this regard and a single test fixture 102 can be used for multiple tests.

To assist in positioning the ECB 108 properly on the test fixture, the upper probe plate 110 can include one or more alignment features. For example, one or more alignment posts 128 can extend from the upper surface of the upper probe plate 110. The posts 128 can be positioned on the upper probe plate 110, such that when the posts 128 are aligned with one or more openings 129 in the ECB 108, the contact points 106 are properly aligned with the ends of the probes. Alternatively, the posts 128 can be positioned to align with the edges of the ECB 108. Accordingly, when the ECB 108 is placed on the test fixture 102, guided by the posts 128, the contact points 106 are also properly aligned with the ends of the probes. In yet other embodiments, the upper surface of the upper probe plate 110 can include one or more visual markers to facilitate placement of the ECB 108. However, the present invention is not limited to solely one means for guiding the ECB 108 and any combination of the methods described above can be used.

Figure 4:
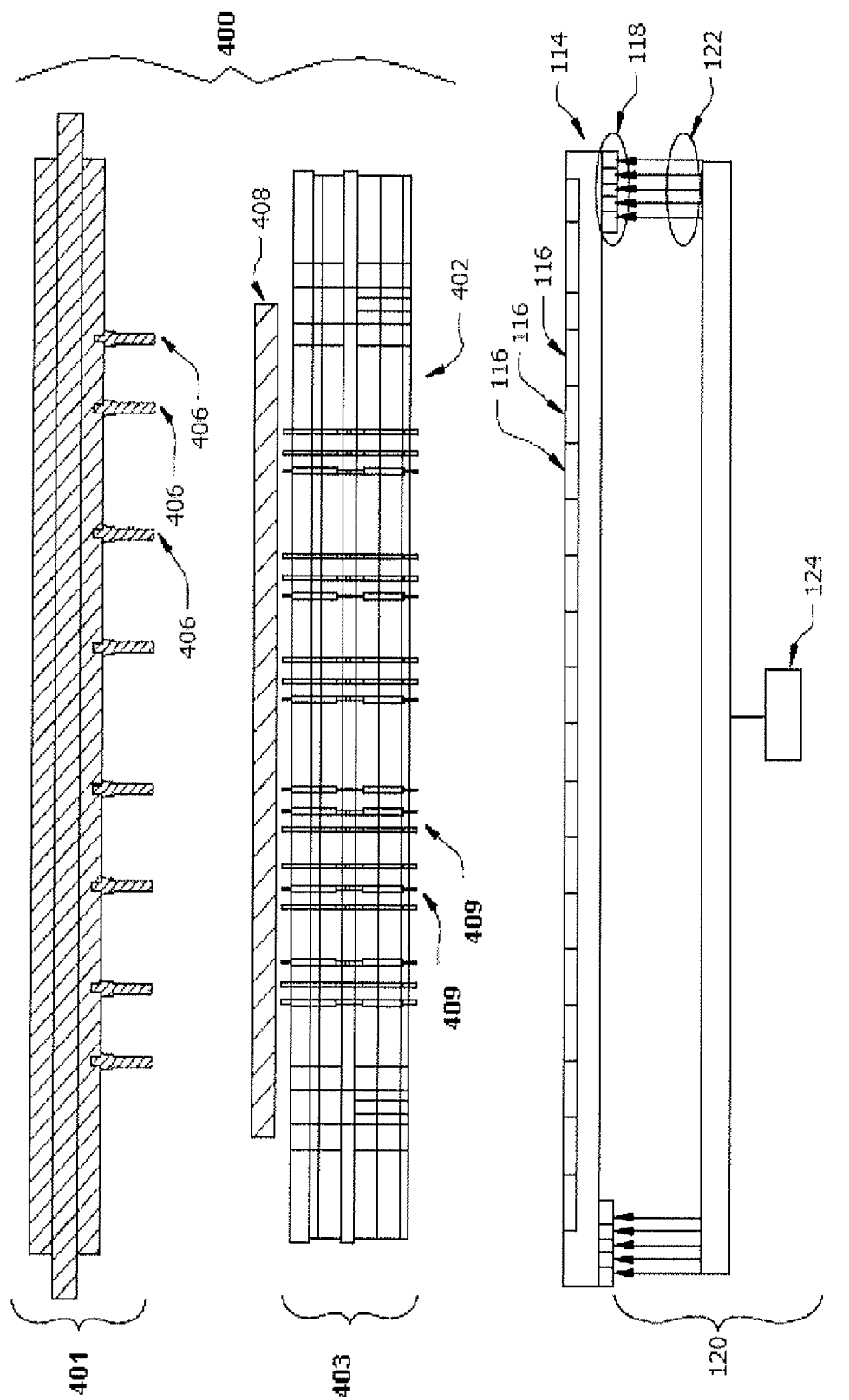
FIG. 4 shows an exemplary embodiment of a cassette for positioning an ECB on a test fixture according to an embodiment of the present invention.

In other embodiments of the present invention, a removable test fixture in the form of a cassette can be used to automate ECB handling and lower testing costs. For example, as shown in FIG. 4, a cassette 400 includes a cassette lid 401 for mating with a test fixture 402 and to press an ECB 408 onto probes 409 of the test fixture 402. The cassette 400 can be configured to mate with an interface fixture 114, coupled to a measurement system 120, as previously described in FIG. 1, 2A-B, or 3A-E. In FIG. 4, the test fixture 402 in the cassette 400 can comprise a plurality of probe plates 403, including the alignment features discussed previously with respect to FIG. 1. The cassette lid 401 can include push pins 406 for compressing the ECB 408 onto the test fixture 400 and to counteract the upward force of the test probes 109 during ECB testing.

Figure 5:
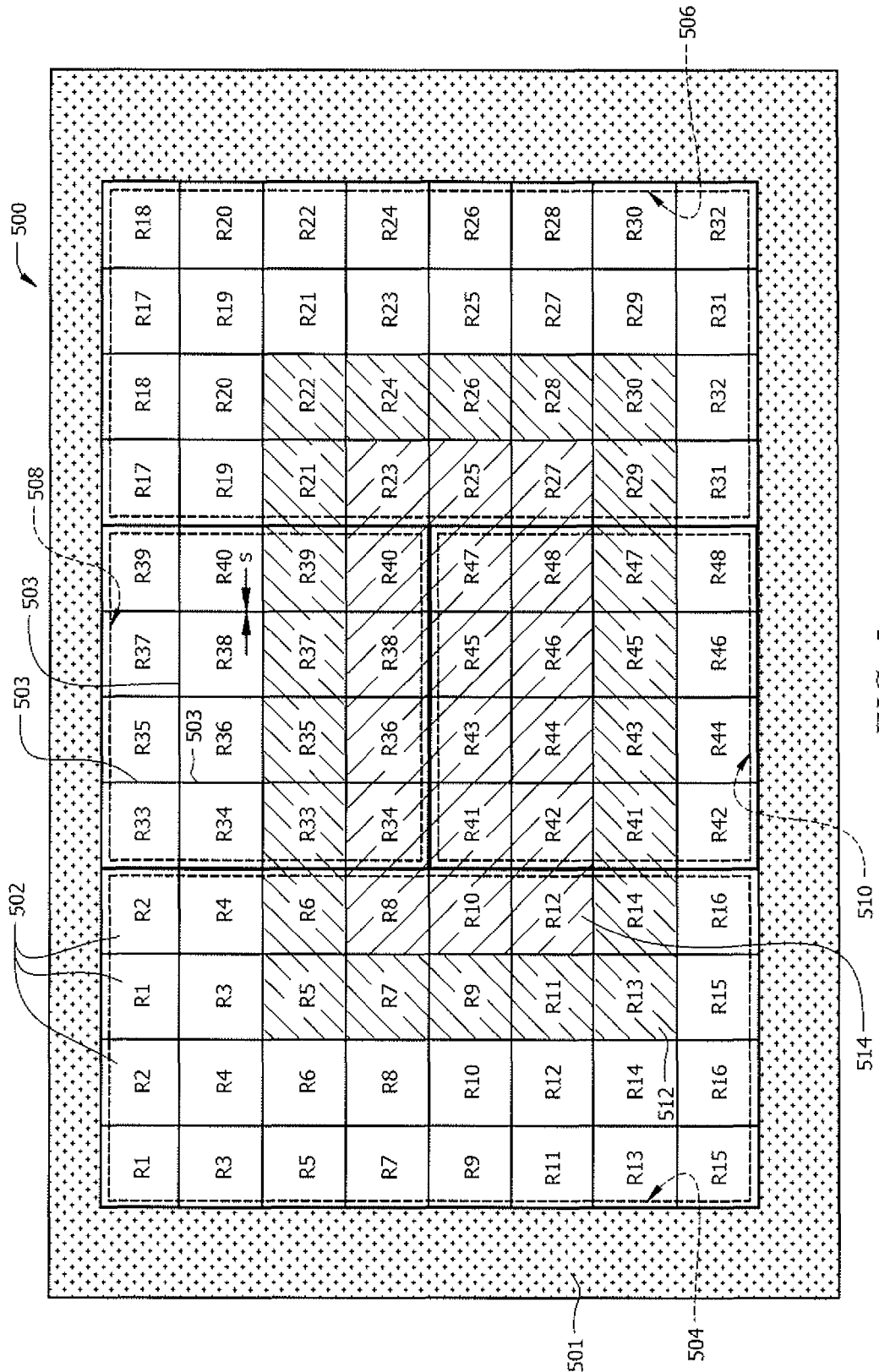
FIG. 5 shows a top view of an interface fixture according to an embodiment of the present invention.

As previously described, one aspect of the present invention is the use of interface fixture that permits the customized test fixture to be used in conjunction with a standardized measurement system. That is, using an interface fixture that can be used to electrically couple a variety of test fixtures with different spatial configurations of probes to a standardized arrangement of probes on a measurement system. FIG. 5 shows a top-down view of an exemplary interface fixture 500 according to an embodiment of the present invention. The interface fixture 500 can comprise an ECB 501 for distributing resources of a measurement system to an array of contact pads 502 on the upper surface 501 of the interface fixture 500. The contact pads 502 can be electrically isolated by isolation regions 503. Although an array of rectangular pads is shown in FIG. 5, the invention is not limited in this regard. In the various embodiments of the present invention, the contact pads 502 can have any shape. For example, other polygon-shaped or elliptical-shaped contact pads can also be used. However, in some embodiments, a shape for the contact pads 502 can be selected that minimizes the spacing(s) between adjacent pads, such as the array of rectangular contact pads 502 shown in FIG. 5 or an arrangement of interlocking polygons. Additionally, in other embodiments, the arrangement of contact pads 502 is not limited a regular array of rows and columns shown in FIG. 5. For example, in some embodiments, alternating rows or columns can be offset. Additionally, the width(s) of the isolation regions can vary across the surface of the interface fixture 500.

In the various embodiments of the present invention, different groups of contact pads 502 can be associated with or connected to different testing resources of a measurement system. That is, a many-to-one arrangement of contact pads and resources. Accordingly, the number of contact pads 502 is selected to be larger than the number of resources of the measurement system. This allows access to test resources to be duplicated in the contact pads 502 to allow different alignments of the ECB for connecting to the different resources of the measurement system. Additionally such a configuration permits ECBs of various sizes to be used with the interface fixture 500 without requiring a change to the measurement system resource configuration. As used herein, "resources", refers to input and/or output nodes of a measurement system. In some embodiments, contact pads can be arranged by zones. In such embodiments, each zone can be used to provide a duplicate set of contact pads for accessing the resources or nodes found in a measurement system. By way of example, and not by way of limitation, an exemplary system can have 5 zones of 5,184 contact pads each, each zone duplicating the 5,184 nodes of an AGILENT™ 3070 in-circuit tester. In other embodiments, the resources can be connected to the contact pads in different patterns.

For example, resources can be connected to the contact pads 502 in a random pattern or arrangement. However, an ordered pattern or arrangement can also be used. For example, as illustrated in FIG. 5, an alternating "H" pattern can be used to connect pads 502 to resources of the measurement system. An alternating "H" pattern, as used herein, refers to a pattern in which the contact pads are divided into 4 zones 504, 506, 508, and 510, as shown in FIG. 5.

Furthermore, in the alternating "H" pattern, each row of contact pads in zones 504 and 506, is sequentially associated with two or more unique ones of the resources of the measurement system. That is, for each row in zones 504 or 506, a unique group of resources, having a number less than the number of contact pads in the row, is connected in sequence across the row to consecutive contact pads in the row until all resources are connected to one of the contact pads in the row. For example, as shown in FIG. 5, if resources R1 and R2 are uniquely associated with the first row of contact pads in zone 504, the first two of contact pads 502 in this first row are connected to resources R1 and R2. For the remaining contact pads in the row, the connection sequence of contact pads and resources is repeated across the row until all remaining contact pads in the row are connected to one of the resources associated with the row. For example, as shown in FIG. 5, the connection sequence R1, R2 for the first and second of contact pads 502 in zone 504 is repeated for the third and fourth of contact pads 502 in zone 504. Resources can be connected in a same fashion for the remaining rows in zone 504 and for the rows in zone 506. That is, a unique group of resources is selected for each of these remaining rows. These selected resources are then connected to contact pads sequentially and repeatedly across the row, as described above and as shown in FIG. 5 for remaining resources R3-R16 in zone 504 and resources R17-R32 in zone 506. Although the exemplary embodiment in FIG. 5 shows a row of contact pads connected to only two resources, the present invention is not limited in this regard. In other embodiments of the present invention, an alternating "H" pattern of contact pads can be formed using any number of resources uniquely associated or selected for a row.

Additionally, in the alternating "H" pattern, each column of contact pads in zones 508 and 510, is also sequentially associated with two or more unique ones of the resources of the measurement system. That is, for each column in zones 508 or 510, a unique group of resources, having a number less than the number of contact pads in the column, is connected in sequence across the column to consecutive contact pads in the column until all resources are connected to one of the contact pads in the column. For example, as shown in FIG. 5, if resources R33 and R34 are uniquely associated with the first column of contact pads in zone 508, the first two of contact pads 502 in this first column are connected to resources R33 and R34. For the remaining contact pads in the column, this connection sequence of contact pads and resources is repeated across the column until all contact pads in the column are connected to one of the resources associated with the column. For example, as shown in FIG. 5, the connection sequence R33, R34 for the first and second of contact pads 502 in zone 508 is repeated for the third and fourth of contact pads 502 in zone 508. Resources can be connected in a same fashion for the remaining columns in zone 508 and for the columns in zone 510. That is, a unique group of resources is selected for each of these remaining columns and these selected resources are connected to contact pads sequentially and repeatedly across the column, as described above and as shown in FIG. 5 for resources R33-R40 in zone 508 and resources R41-R48 in zone 510. Although the exemplary embodiment in FIG. 5 shows a column of contact pads connected to only two resources, the present invention is not limited in this regard. In other embodiments of the present invention, an alternating "H" pattern of contact pads can be formed using any number of resources can be uniquely associated or selected for a column.

The present Inventors have found that this alternating "H" pattern is advantageous over random patterns of resources. In particular, the present Inventors note that an ECB is typically not completely self-contained and therefore must provide or be provided with external electrical connections. For example, in an ECB contacting a bus of a computing device, the connector interface exchanges various electrical signals to communicate and operate with the computing device. For practical reasons, these external electrical connections are typically arranged on the perimeter of an ECB. Furthermore, to conserve space on the ECB and for other performance considerations, these connections are frequently created in a dense array of electrical contacts. Generally, these same electrical connections may be used to provide electrical test contacts.

As result, because testing typically requires using test points around the perimeter of the ECB, an alternating "H" pattern, as described above can be used to provide an increased number of unique tester resources to such ECBs. Since each contact pad contained in the rows and columns of four zones are provided in an ordered arrangement, unique measurement resources can be guaranteed, by design, depending on size and spacing. For example, the perimeter of an ECB may contact all four zones 504, 506, 508 and 510 along shaded region 512, as shown in FIG. 5. Therefore, because a unique set of resources is associated with each column in zones 508 and 510, the ECB perimeter in these zones will lie along a path defined by contact pads 502 that are each assigned to a unique resource. Similarly, because each row in zones 504 and 506 is associated with a unique set of resources, the ECB perimeter in these zones will lie along a path defined by contact pads 502, each of which are also assigned to unique set of resources.

Additionally, the alternating "H" arrangement also provides a central area 514 of unique tester resources which offers two advantages. The first advantage is for smaller ECBs which typically have a limited number of test points. In this case, duplication of tester resources may be of increased concern. However, as described above, a perimeter of an ECB in a interface fixture 500 connected to a measurement system in an alternating "H" arrangement generally results in a substantially unique set of resources along the perimeter, regardless of the size of the ECB. Although some duplicates may occur, these can be dealt with, as described below. The second advantage is that the unique central area tends to force the optimum spatial solution to the center of the fixture affording a balancing of probe forces. That is, because a majority of the test points on the ECB are arranged with respect to the perimeter of the ECB, centering the ECB on the interface fixture will generally result in the greatest number of contact pads associated with unique resources in proximity to the ECB and allow the greatest number of circuits and/or parts on the ECB to be tested. However, the invention is not limited in this regard, and any other arrangement of resources can be used in the various embodiments of the present invention.

In the various embodiments of the present invention, the interface fixture 500 is able to couple the customized test fixture and the standardized measurement system by providing contact pads 502 that permit a position of a contacting end of a probe in the test fixture to be laterally shifted within an area defined by each contact pad 502 without losing electrical contact with the contact pad 502. This concept is illustrated in FIG. 6.

Figure 6:
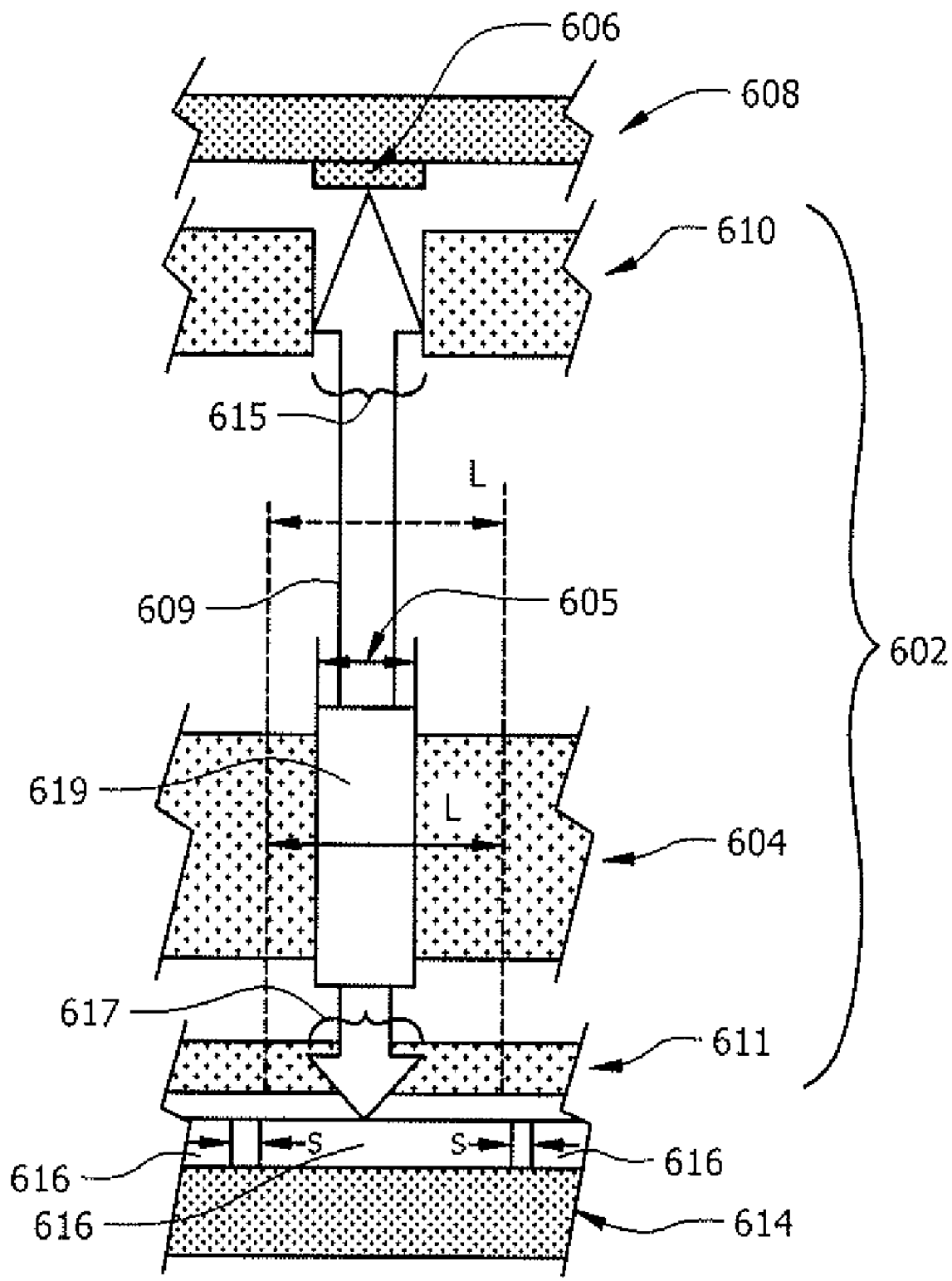
FIG. 6 shows an enlarged view of a portion of an exemplary test system according to an embodiment of the present invention.

FIG. 6 shows a close-up view of a portion of an exemplary test system 600 according to an embodiment of the present invention. As shown in FIG. 6, the system 600 includes a test fixture portion 602 and an interface fixture portion 614. In the various embodiments, the interface fixture 614 can be coupled to a measurement system, as previously described. The test fixture portion 602, as previously described, can include a plug probe plate 604 having openings 605 with a barrel 619 of probes 609 affixed therein, as previously described. The test fixture 602 can also include upper 610 and lower 611 probe plates, also as previously described. The probes 609 can contact the contact pads 616 on an upper surface of the interface fixture 614, which are coupled to a measurement system, and test points 606 of an ECB 608, as previously described.

In the various embodiments, the contact pads 616 have a relatively large surface area as compared to the surface of the tip of the contacting probe 609. Accordingly, this large contact area for the contact pad 616 allows openings 605, 615, and 617 to be centered essentially on any location within the perimeter of the contact pad 616. That is, the center of each opening 605, 615, 617 in the test fixture can be individually shifted laterally (direction L) with respect to the center of a corresponding contact pad 616. Therefore, by allowing the position of each probe 609 to be individually shifted over each contact pad 616, a variety of spatial arrangements of probes in the test fixture 602 can be provided. This permits the test fixture 602 to contact an irregular pattern of test points 606 of an ECB 608 while still remaining in contact with the regular arrangement of contact pads 616 in the interface fixture 614.

However, using a vertical arrangement of the openings 605, 615, and 617 is not always practical. For example, as previously described, contact pads 616 need to be electrically isolated from adjacent contact pads and each of the contact pads 616 is separated by a spacing s, as shown in FIG. 6. Accordingly, some of the area within array of contact pads 616 cannot be used for electrical connection to probes in the test fixture. As a result, utilizing a vertical arrangement of the openings 605, 615, and 617 is not possible in cases where test points are in close proximity or lie above the areas between contact pads. Arrangement of the openings 605, 615, and 617 is also limited by manufacturability. For example, variations in the manufacture of the test fixture and the interface fixture can introduce misalignments of probes and contact pads. As a result, a test fixture design having a probe 609 contacting a contact pad 616 near its edge can result in a failure to contact the contact pads. Even worse, depending on the shape of the end of probe 609, two or more adjacent contact pads 616 can be shorted. Consequently, in some embodiments of the present invention, the actual area of a contact pad available for a probe to contact can be limited. Such a concept is illustrated in FIG. 7.

Figure 7:
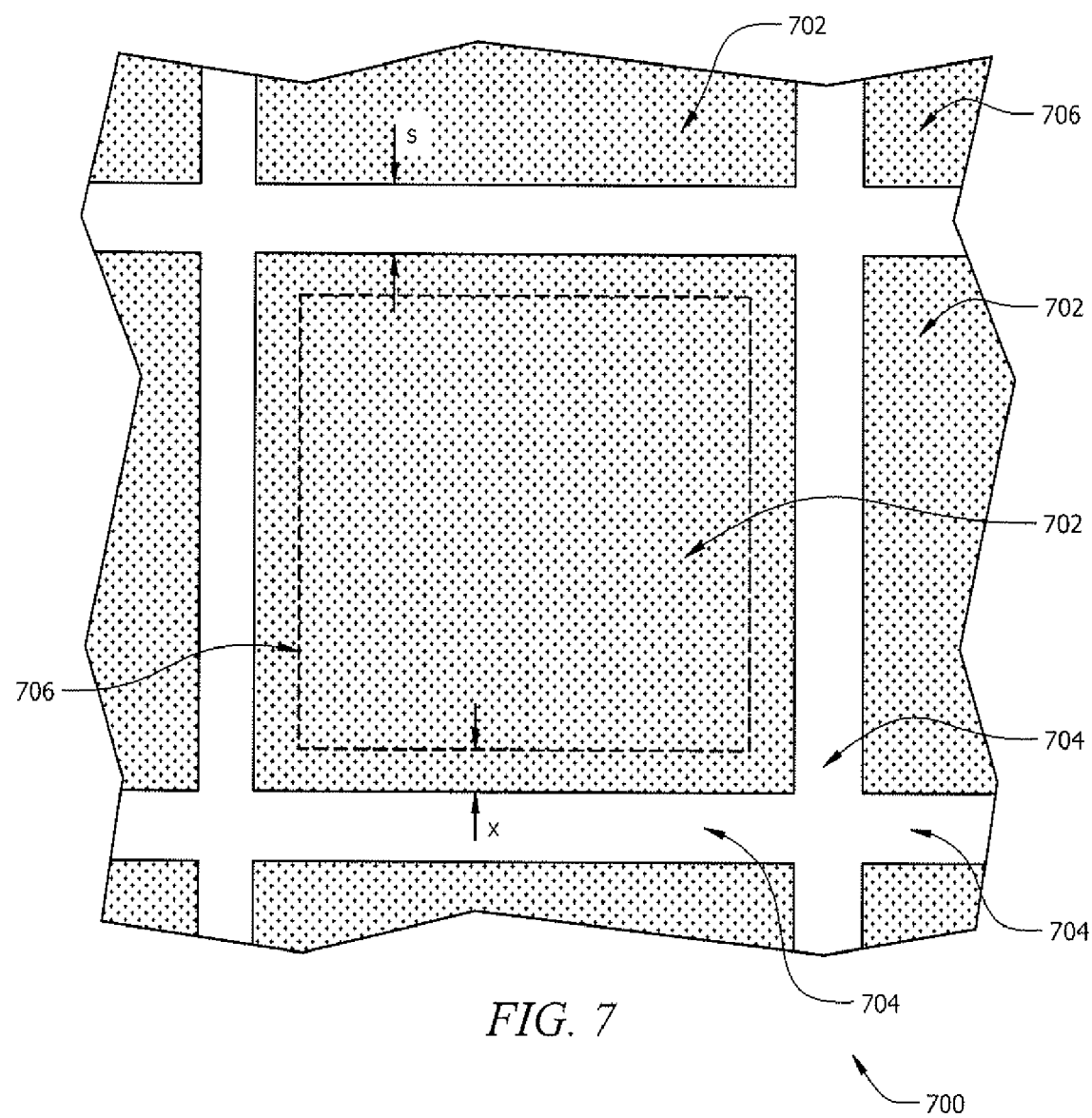
FIG. 7 shows an enlarged view of a portion of an array of contact pads in an interface fixture according to an embodiment of the present invention.

FIG. 7 shows a top-down view of a portion of an interface fixture 700 according to an embodiment of the present invention. In FIG. 7, the contact pads 702 are placed in an array covering at least a portion of the upper surface of interface fixture 700. However, the contact pads 702 can be configured to be separated by isolation regions 704, as previously described with respect to FIG. 5. Accordingly, when openings are made in the test fixture, the openings cannot be centered in these regions. Additionally, to ensure sufficient process margin during fabrication of the test fixture, an outer area of each of the contact pads 702 can also be designated as an area in which openings in the test fixture cannot be centered. For example, for a 0.09 inch by 0.09 inch contact pad 702 separated from other contact pads 702 by 0.01 inch wide isolation regions 704, a 0.01 inch width (x) can also be used to designate the unavailable portions for the contact pad 702. Accordingly, during manufacture of the test fixture, openings for probes can be configured to guide probes to the portions of the contact pads 702 that are inside area 706. However, the invention is not limited to the configuration described above. In the various embodiments of the present invention, the size of the contact pads 702, the isolation regions 704, and area 706 on the contact pad 702 can vary dependent on the accuracy of process used for making the openings in the test fixture. Therefore, as the accuracy during manufacturing increases, the widths of the isolation regions 704 (s) and widths of the unavailable regions of the contact pads (x) can be decreased.

To overcome the limitations of contact pad area and the fixed arrangement of test points on the ECB, the various embodiments of the present invention provide for using rigid probes or probes with flexible or deformable portions and probe plates with varying arrangements of openings in each of the probe plates. That is, referring back to FIG. 1, the arrangement of openings in the probe plates 110, 104, and 111 associated with each of probes 109 are adjusted to guide the probes 109 between a test point 106 of the ECB 108 and valid portions of the contact pads 116. Therefore, in the various embodiments of the present invention, the openings can be used to guide linear probes, non-linear rigid probes, or deformable probes. This concept is illustrated with respect to FIG. 8.

Figure 8:
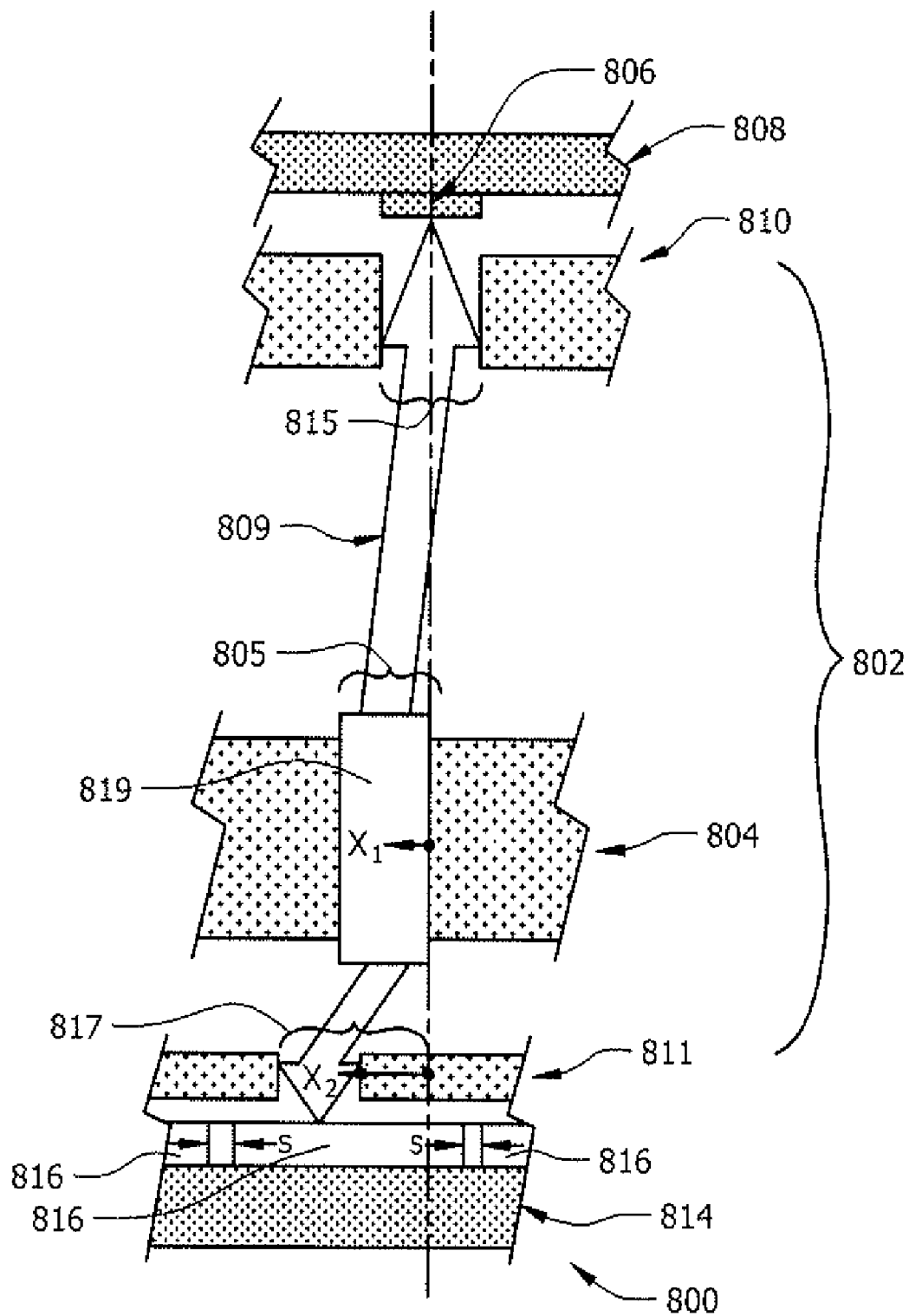
FIG. 8 shows an enlarged view of a portion of an exemplary test system according to another embodiment of the present invention.

FIG. 8 shows another close-up view of a portion of an exemplary test system 800. As in FIG. 6, the system 800 in FIG. 8 includes a test fixture portion 802 and an interface fixture portion 814 coupled to a measurement system, as previously described with respect to FIGS. 1, 2A, and 2B. The test fixture portion 802, as previously described, can include a plug probe plate 804 having openings 805 with a barrel 819 of probe 809 affixed therein, as previously described. The test fixture 802 can also include upper 810 and lower 811 probe plates, also as previously described. The probe 809 can contact the contact pads 816 on an upper surface of the interface fixture 814, which are coupled to a measurement system, and test points 806 of an ECB 808, as previously described.

However, unlike FIG. 6, at least one of openings 805 and 817 are laterally offset from opening 815 to allow a probe 809 to contact the contact pad 816 non-perpendicularly. That is, an intentional offset between openings in the upper probe plate 810 and at least one of the plug probe plate 804 and the lower probe plate 611 is provided to deflect and guide the contacting end of probe 809 between a test point 806 of the ECB and a contact pad 816. Accordingly, the openings 805 in the plug probe plate 804 can be intentionally offset from the openings 815 in the upper probe plate by providing a lateral offset $x_1$ for opening 805. In some embodiments, deflection of the upper end of probe can be sufficient for allowing the probe 809 to contact a test point 806 of the ECB 808 and a contact pads. However, if further routing is still needed, the openings 817 in lower probe plate 811 can be used, resulting in total a lateral offset of $x_2$ for opening 817 with respect to opening 815. In the various embodiments of the present invention the maximum and minimum amount of offset ($x_2$) is dependent on the length of the ends of the probes, the flexibility of the ends of the probes, and the accuracy of the probe plate drilling process. Accordingly, as the length of the ends of the probes increases and flexibility of these ends increase, the maximum amount of deflection, and thus the maximum offsetting of the openings 805 and 817 with respect to opening 815, is increased.

In contrast, some drilling processes can result in unintentional offsets. Therefore, the minimum amount of intentional offset is limited by the drilling processes for the upper and lower probe plates. For example, in a common configuration for drilling openings in an ECB, the opening placement accuracy of the drilling process is between 0.0005 and 0.001 inches for each of the upper and lower probe plates. Therefore, the minimum amount of intentional offset can be greater than 0.001 to 0.002 inches between the openings upper and lower probe plates to ensure an intentional amount of offset is achieved. Accordingly the minimum offset can be between 2% and 5% of the maximum allowable offset, depending on the probe configuration.

Figure 9C:
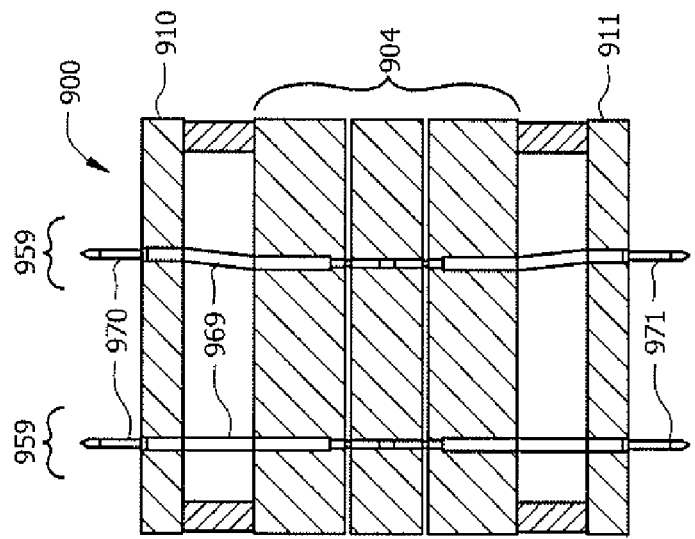
FIGS. 9A-9C show exemplary configurations of probes for a test fixture in accordance with an embodiment of the present invention.
Figure 9B:
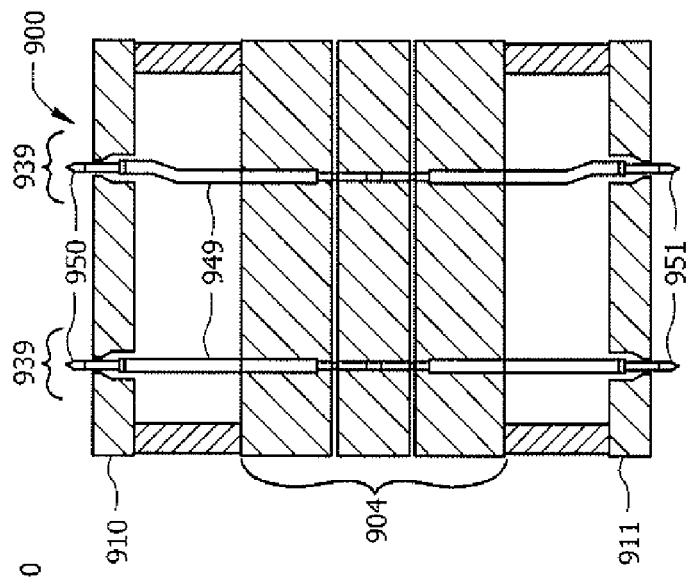
Figure 9A:
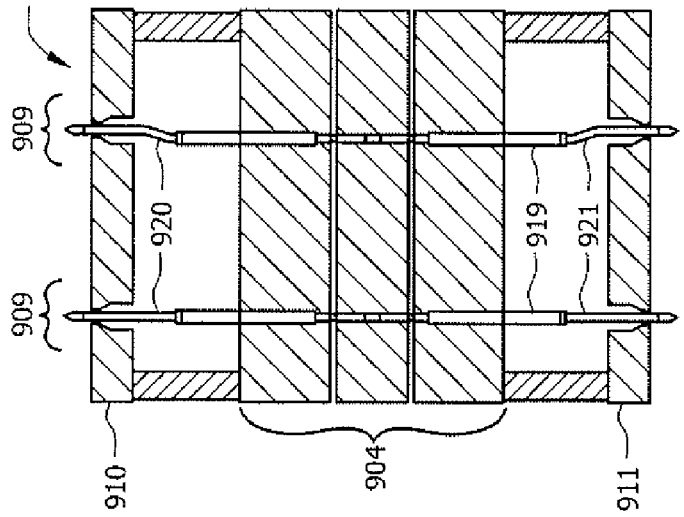

However, the present invention is not limited to solely the deformation of the probes illustrated in FIG. 8. In other embodiments, various types of deformation can be provided, as shown in FIGS. 9A-9C. In FIGS. 9A-9C, a portion of a test fixture 900 having an upper probe plate 910, a lower probe plate 911, and a plug probe plate portion 904 is shown. In FIG. 9A, a first type of probe 909 is shown. Probe 909, like the probe 809 in FIG. 8 includes a barrel 919 and upper 920 and lower 921 flexible or deformable probe ends, as previously described. As shown in FIG. 9A, the upper 920 and lower 921 ends of the probe 909 can be deformed according to the arrangement of openings in the probe plates 904, 910, and 911, as previously described.

In some embodiments, rather than providing for deformation of the ends of a probe, deformation of the barrel portion of the probes can be provided. This is illustrated in FIGS. 9B and 9C. In FIG. 9B, a second type of probe 939 is shown. Probe 939, like the probe 909 includes a barrel 949 and upper 950 and lower 951 probe ends. However, unlike probe 909, the end portions of the barrel deform to place the upper 950 and lower 951 probe ends in a position to match the arrangement of openings in the probe plates 904, 910, and 911. As shown in FIG. 9B, the barrel 949 deforms based on force exerted by the openings on the probes ends 950 and 951.

Similarly, in FIG. 9C, probes 959 includes a barrel 969 and upper 970 and lower 971 probe ends. As with probes 939, the end portions of the barrel 969 deform to place the upper 970 and lower 971 probe ends in a position to match the arrangement of openings in the probe plates 904, 910, and 911. However, as shown in FIG. 9C, the barrel 969 deforms based on force exerted by the openings on the barrel 969. Such a configuration can be advantageous over that of FIGS. 9A and 9B in that the force is not exerted on the typically more fragile portion of the probes, the contacting ends. Furthermore, exerting such a side load on the probes ends can prevent a spring mechanism within the probes from operating properly, as described below.

Accordingly, based on the types of probes being used, a lateral probe deflection (LPD) distance can be defined, describing the maximum allowable lateral deflection of the probe during assembly of the test fixture. Although the LPD distance can be equal to the maximum deflection possible, this can eventually result in mechanical failure of the probe due to deflection stress. As a result, the LPD distance can be less that the maximum allowable deflection possible to increase lifetime of the test fixture. For example, in one embodiment, probes manufactured by Q.A. Technologies under the X-PROBE™, specifically part numbers X75-PRP2540S and X50-PRP2540S with probe ends 999-Q729G provide probes with each end deforming up to 0.025 inches to provide a total LPD distance of 0.05 inches for the probes. However, the invention is not limited to the exemplary probes described above. In the various embodiments of the present invention, any type of deformable probes can be used with the various embodiments of the present invention. Furthermore, in some embodiments deformation provides only a portion of the LPD distance. In some embodiments, the LPD distance can be enhanced by mounting the barrel in the plug probe plate at an angle.

As result of the configuration shown in FIGS. 8-9C, the arrangement of openings in the upper probe plate can be identical or substantially identical as the arrangement of test points in the ECB. However, in some embodiments, if the upper probe plate is separated from an ECB, a small offset may be required, depending on the deformation characteristics of the end of the probe contacting the test point and the lateral distance between the test points and valid regions of the contact pads.

Figure 10A:
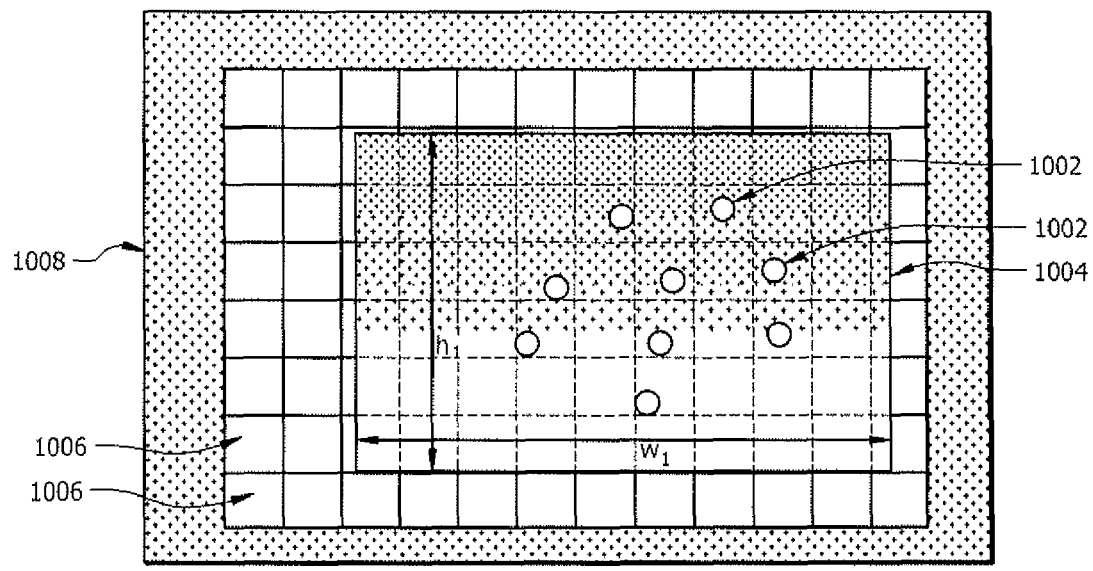
FIG. 10A shows an exemplary arrangement of openings for a first test fixture for a test system according to an embodiment of the present invention.
Figure 10B:
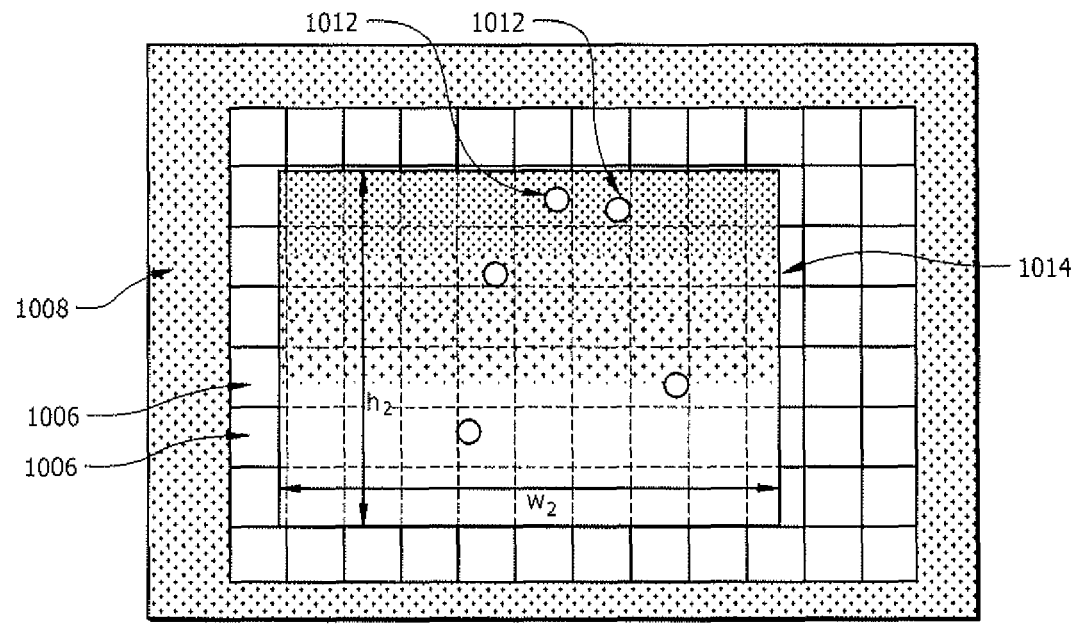
FIG. 10B shows an exemplary arrangement of openings for a first test fixture for a test system according to an embodiment of the present invention.

The ability to adjust the spatial arrangement of the probes, allows test fixtures to be designed to have different spatial arrangements for each ECB or for each test to be performed. For example, positioning of exemplary ECBs for an exemplary interface fixture in accordance with the various embodiments of the present invention are shown in FIGS. 10A and 10B. In FIG. 10A, a first ECB 1004 is shown having an arrangement of test points 1002. Accordingly, a test fixture would be provided with openings positioned over an array of contact pads 1006 of an interface fixture 1008 so that each of the openings is positioned to allow probes in the test fixture to contact test points 1004 to route signals to one of contact pads 1006. In FIG. 10B, a second ECB 1014 is shown having an arrangement of test points 1012. Similarly, a test fixture would be provided with openings positioned over an array of contact pads 1006 of an interface fixture 1008 so that each of the openings is positioned to allow probes in the test fixture to contact test points 1012 to route signals to one of contact pads 1006.

As the test points of the ECB get closer to the edge of one of the contact pads 1006, offsets in the probe and/or a lower probe plate can also be provided for probes in the openings 1012, as described above with respect to FIG. 8. FIGS. 10A and 10B also illustrate that the test fixture is not limited to testing of a single size ECB. For example, in FIGS. 10A and 10B, the width of ECB 1004 is wider than that of ECB 1014 (w1>w2). Similarly, the height (h1) of ECB 1004 and the height (h2) of interface fixture 1014 can be the same or different. FIGS. 10A and 10B also illustrate that the test fixture is not limited to placing ECBs a single position on the interface fixture. Accordingly, the test fixture can be configured to not only have a unique arrangement of openings for an ECB, but can also have a unique position on the interface fixture. In the various embodiments of the present invention, the position can vary for several reasons. For example, in some cases, the size of the ECB, the position of the test points on the ECB, the ECB test point topology in relation to the electrical component connections, and the resources associated with the contact pads can require a particular arrangement on the interface circuit.

In the various embodiments of the present invention, the position for the openings in the upper probe plate, the lower probe plate, and the probe plates can be determined manually or automatically. That is, based on the position of the test points on the ECB and the arrangement of contact pads on the interface fixture, the position and/or angle for each of the probes in the test fixture can be determined. In some embodiments, this can be performed using a computer-implemented method for designing the test fixture.

For example, in some embodiments of the present invention, the positions of openings in the probe plates in the test fixture can be determined by importing design data for the ECB and comparing it to the arrangement of contact pads. Based on this comparison a best alignment of contact pads and test points of the ECB can be determined. This alignment can then be used to determine which contact pads are to be used and a position of openings needed in the various probe plates required for contacting these contact pads.

Figure 11:
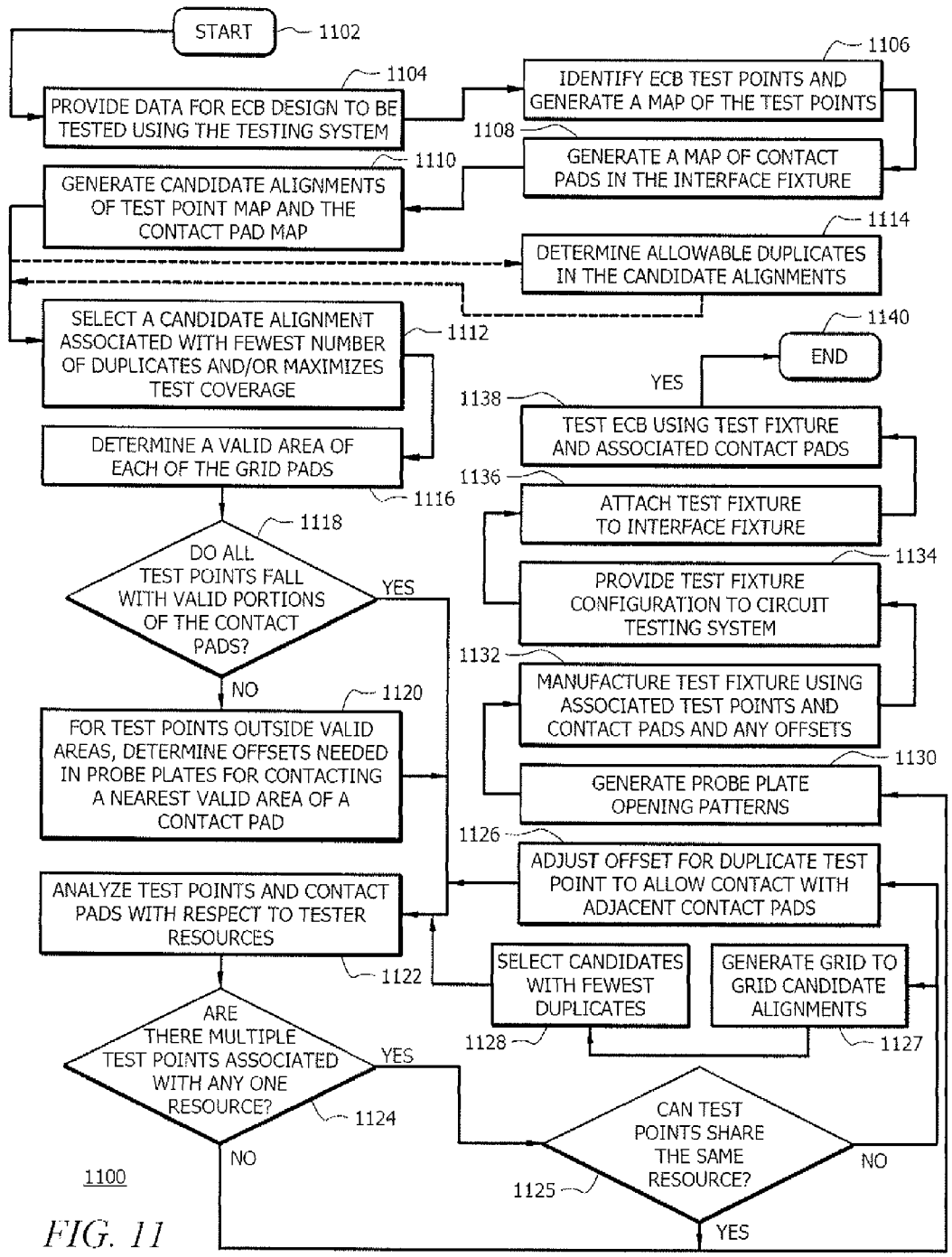
FIG. 11 shows an exemplary method for testing devices, including design of a customized test fixture, using a test system in accordance with an embodiment of the present invention.

An exemplary method 1100 for designing a test fixture is shown in FIG. 11. Method 1100 begins with step 1102 and continues to step 1104. In step 1104, a design of the ECB to be tested is provided. In the particular, the ECB design can provide the location of test points on the surface of the ECB for one or more particular tests to be performed. In some embodiments, the design can be provided as a computer-aided drafting (CAD) design of the ECB having test points identified in the design. However, in other embodiments, the entire design for the ECB need not be provided. For example, ECB data provided can include the dimensions of the ECB and a list of coordinates on the ECB within the given dimensions. In yet another embodiment, given a CAD design, the user can be prompted to identify the test points for the ECB in the CAD design. One of ordinary skill in the art will recognize that the location of test points on the ECB can be provided in any number of ways and is not limited to the examples above.

Regardless of how the location of the test points on the ECB is provided, once these locations have been provided in step 1104, the method 1100 generates a map of the test points in step 1106. Afterwards, in step 1108, a map of the contact pads of the interface fixture can be generated. In the various embodiments of the present invention, the map of the contact pads can be generated from any type of data, including any methods previously discussed for generating the map of the ECB test points in steps 1104 and 1106. Once the test point map and contact pad map have been generated in step 1106 and 1108, the maps can be overlaid and compared in step 1110. The maps can then undergo an initial alignment. In this initial alignment, the assumption is made that each contact pad is assigned to a unique resource of the measurement system.

This assumption is made to increase efficiency of the alignment process because significant computation time is generally required for this initial alignment. Therefore, computation time can become prohibitive if additional processing, such as considering the test system measurement resources connections, is taken into consideration. For example, the contact pad in FIG. 7 is 0.1×0.1 inches including contact spacing. Assuming a 0.001 inch increments during the initial alignment process, all of the ECB test points must be analyzed 100×100 or 10,000 times within a single contact pad. Therefore, adding another variable to consider, test system measurement resources over the entire contact surface area, would require a significant amount of additional computations.

In method 1100, the purpose of the initial alignment is to reduce the number of duplicate connections to each of the contact pads and maximize test coverage. Test coverage is calculated by analyzing the nodal connectivity of the ECB is relation to duplicate connections. In some embodiments, different counting algorithms for duplicates can be used. For example, rather than simply counting the number of test points aligned to a contact pads, duplicates can be counted by determining the number of testable components aligned to the contact pad. Such a configuration can be provided when an available measurement system is only effective at measuring certain types of components. Thus, based on the locations of test points in the test fixture map and the areas of contact pads in the contact pad maps, an alignment of the maps can be obtained in which the number of duplicates in the test fixture map falling within the same contact pads is minimized and test coverage is maximized.

Accordingly, in step 1110, a number of candidate alignments of the test point and contact pad maps can be generated. That is, a number of possible alignments in which the positions of the locations of the test points are laterally adjusted by no more that a largest dimension of the contact pads. For example, for contact pads having a width of approximately 0.1 inches, the overlay can be adjusted in 0.001 to 0.010 inch increments. However, the invention is not limited to these sizes of contact pads or these specific adjustment increments. Furthermore, in the various embodiments of the present invention, such adjustments can include lateral and/or rotational adjustments. For a rotational adjustment, any increment can be used, however such a rotational adjustment can be limited to allow only a maximum lateral adjustment in an x or y direction that is less that the size of the contact pad. As one of ordinary skill will recognize, larger adjustments are not required, since the assumption in step 1110 is that each contact pad is associated with a unique resource and larger adjustments would not provide and additional candidate alignments.

Once the candidate alignments are generated in step 1110, the candidate that minimizes the number of duplicate connections is selected in step 1112. That is, the candidate in which the largest number of test point locations are each associated with unique contact pads can be selected. In some embodiments, the configuration of the ECB or the test program allows duplicate connections to be made to single resources of the measurement system.

However, the determination of allowable duplicates can also be based on the design provided in step 1104 and/or any test information available to minimize duplicates and maximize test coverage. For example, the CAD design provided in step 1104 can specify connectivity information for ECB, that is, information on which portions of the ECB need to be test. Alternatively, if a test program is already available for a circuit of net of the ECB, the test program can be used to extract such information. This information can be used in cases where a number of candidate alignments with the same minimum number of duplicates are available.

In embodiments of the present invention where connectivity information is available, the candidate alignments can be prioritized according to the test coverage (i.e., the number of test that can be performed using the alignment). In such embodiments, the ECB data can be evaluated with respect to known information about the measurement system being used in order to determine the number of tests that can be performed for the ECB using the alignment. Accordingly, to maximize the test coverage, each alignment candidate can be prioritized according to the test coverage the alignment provides. Therefore, the candidate alignment selected in step 1112 can be based on minimizing the number of duplicates, maximizing the test coverage, or both.

Once the test point and the contact pad maps have been spatially aligned in steps 1110-1014, the method 1100 can further determine whether any of the probes that will be used for contacting the test points will require additional routing by offsetting openings in the probe plates, as previously described with respect to FIG. 11. First, in step 1116, the valid areas of the contact pads can be determined. That is, as previously, described with respect to FIG. 7, the isolation areas and the unavailable contact areas for each of contact pads can be determined. If any of the test points fall within these area in step 1118, a total offset needed between the upper and lower probe plates is determined and an offset for the probe plate and/or the guide plates is determined in step 1120. This required offset can be based on available probe information specifying the amount of deflection possible for each probe, as previously described, as well as the spacing and arrangement of the probe plates. Such routing is conceptually illustrated in FIG. 12.

Figure 12:
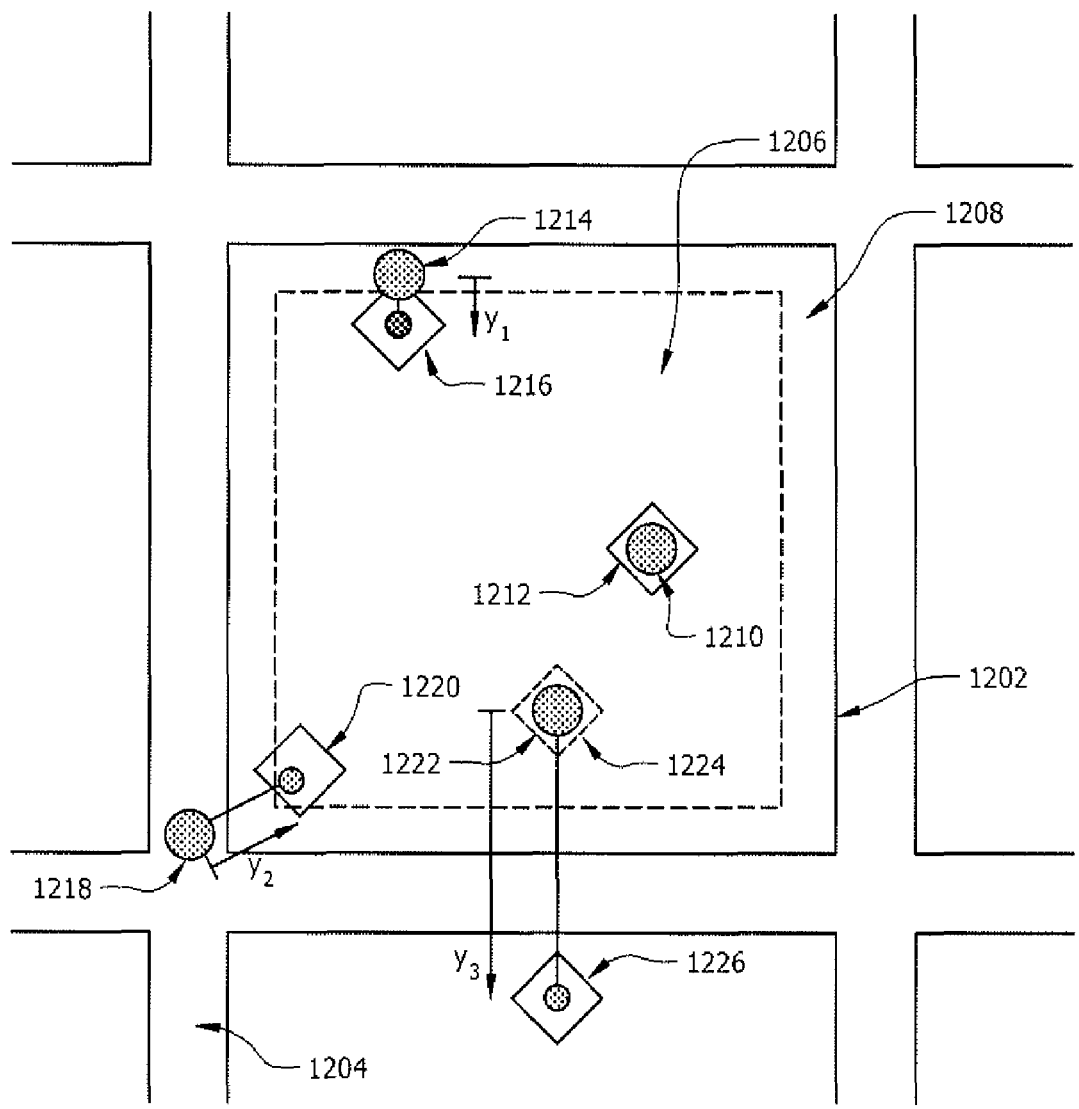
FIG. 12 shows a schematic illustration of rerouting of contact points according to the various embodiments of the present invention.

FIG. 12 shows a portion of the interface fixture in accordance with an embodiment of the present invention. As previously described for FIG. 7, the interface fixture can include an array of contact pads 1202 separated by isolation regions 1204. The contact pads 1202 can also have available 1206 and unavailable 1208 regions for contacting the contact pad 1202, a previously described. In method 1100, when a test point falls within the available region 1206 of the contact pad 1202, an opening 1210 for the upper probe plate and opening 1212 for a lower probe plate can be coincident. That is, they can be vertically aligned with no offset. However, when a test point falls within the unavailable region 1208 of the contact pad 1202, an opening 1214 for the upper probe plate and opening 1216 for a lower probe plate need to be offset to allow contact to the available region 1206 of the contact pad 1202. In particular, the opening 1216 is offset in the direction of the available region 1206 of the contact pad, providing an offset $y_1$ between openings 1214 and 1216. Similarly, for a test point falling within an isolation region 1204, an offset $y_2$ can be provided between openings 1218 and 1220 in the upper and lower probe plates, respectively. Although the different openings are represented as diamonds and circles, the present invention is not so limited. Rather these particular shapes are provided merely for purposes of illustrating the present invention. In the various embodiments of the present invention, the openings. 1210-1220 can have any shape.

Referring back to FIG. 11, if all test points are within valid areas of the contact pads in step 1118 and/or after all offsets have been calculated in step 1120, the method can continue to step 1122. In step 1122, the arrangement of test points with respect to the contact pads can be analyzed with respect to the tester resources. That is, an inventory of which test resources the test points are currently associated with, via the contact pads is obtained. In some cases, the net result of alignment of the test point map and contact pad map in steps 1110-1114, is multiple test points may still be contacting the same contact pad or may be contacting different pads associated with a same resource. In either case, the result is different test points connected to a same resource, possibly resulting in undesirable shorts between different circuits or nets on the ECB. Therefore, a further calculation of offsets or alignment candidates can be required to isolate these test points. Accordingly, the method can first determine in step 1124 whether any such shared resources are present. That is, whether any test points are currently associated with a same resource. If not, the method can proceed to step 1128.

If at least one shared resource is found in step 1124, the method 1100 can determine if the test points can be connected to the same resource in step 1125. This determination can be made based on the design provided in step 1104 and/or any test information available. For example, the CAD design provided in step 1104 can specify which portions of the ECB need to be isolated during testing, such as a particular circuit path of the ECB. Alternatively, if a test program is already available for a portion of the ECB, the test program can specify whether isolation is required. If the test points can share the same resource in step 1125, the method can proceed to step 1128. However, if the test points cannot share the same resource in step 1125; the method 1100 can associate at least one of the test points with a different adjacent contact pad in step 1126. That is, an offset can be added or adjusted for the probe plate and the lower probe plate to allow one of the duplicate probes to contact to a different contact pad, as described above. This is also conceptually illustrated in FIG. 12.

As shown in FIG. 12, openings 1210 and 1222 in the upper probe plate are associated with test points falling within available area 1206 of the contact pad 1202. If the test points could share the same resource, openings 1212 and 1224 in the lower probe plate could be used. However, if the tester resource cannot be shared, one of openings 1212 and 1224 needs to be moved to an adjacent contact pad to utilize a different tester resource. Accordingly, rather than using openings 1224 for the test point associated with opening 1222, opening 1226, having an offset $y_3$ is used instead. The method 1100 can then repeat steps 1122-1126 until the test points are properly isolated and the openings in the probe and guide plates are updated and finalized. That is, the relationship between all tester resources and test points is iteratively adjusted until the necessary isolation is achieved.

However, in some cases, isolation of tester resources is not achievable by merely offsetting an opening to an adjacent contact pad. Accordingly, in such embodiments, the method 1100 can also perform a grid to grid alignment in order to use a different set of tester resources. For example, in the alternating "H" pattern described with respect to FIG. 5, a lateral shift of at least one contact pad width results in a different orientation and arrangement of resources under at least a portion the test points. The new arrangement can provide an arrangement of contact pads for which isolation of particular portion of the ECB may be easier to achieve.

Therefore, alternatively or in combination with step 1126, a determination of a grid to grid alignment adjustment can be made in steps 1127 and 1128. Similar to steps 1110 and 1112, a number of grid to grid candidate alignments can be generated in step 1127 and evaluated in step 1128. That is, a number of possible alignments in which the positions of the locations of the test points are all laterally adjusted by a distance greater than a largest dimension of the contact pads in step 1127. For example, for contact pads having a width of approximately 0.1 inches, the overlay can be adjusted in increments equal to multiples of 0.1 inches. Afterwards, in step 1128, a candidate alignment resulting in the maximum number of test points associated with unique ones and maximum test coverage is selected in step 1128. Afterwards, steps 1122-1125 can be repeated to determine if additional offsets or overlay adjustments are required.

Once final overlay alignment and offsets are obtained in steps 1122-1128, the opening patterns for each of the probe plates can be generated in step 1130. The patterns can be based on the final offsets and overlay alignment obtained in steps 1122-1128, but also on probe plate spacing information, the number of probe plates to be used, probe plate thickness information and known manufacturing bias. For example, if additional probe plates are to be inserted between a plug probe plate and an upper or lower plug probe plate, the openings in the additional probe plate can have an intermediate offset, depending on the configuration of the probes. In another example, if a process bias is known, the sizes of the openings can be adjusted to compensate for the bias.

Figures 13A, 13B, 13C:
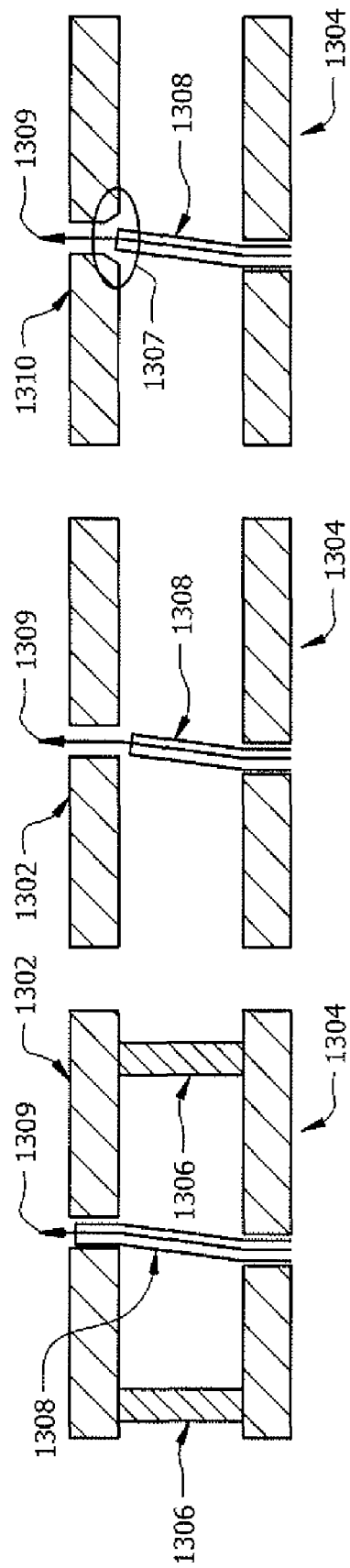
FIGS. 13A-13C show exemplary opening designs for a probe plate according to the various embodiments of the present invention.

In some cases, the process bias can result in improper assembly of the test fixture. This is conceptually illustrated in FIGS. 13A-C. FIG. 13A illustratively shows an upper probe plate 1302 and a plug probe plate 1304 separated by spacers 1306 in accordance with an embodiment of the present invention. In FIG. 13A, the upper probe plate 1302 is manufactured to substantially match the positions of the test points on an ECB. In such embodiments, the arrangement of the probe plates is closely controlled so that the barrel of the probe 1308 will fit into the opening in the upper probe plate 1302. This will side load the probe, but a spring loaded end 1309 extending from end of the probe barrel 1308 typically will still operate properly. However, if the probe plates and probes are not properly arranged, binding of a probe end can occur, this is conceptually illustrated in FIG. 13B.

In FIG. 13B, an improper arrangement of the probes and probe plates in shown. In particular, the barrel 1308 of the probe is not inserted into the opening in upper probe plate 1302. As a result, the probe end 1309, rather than the barrel 1308 is side loaded by the upper probe plate 1302 and the spring mechanism may be inhibited from properly operating. As the thickness of the upper probe plate is increased, the greater the side load and the greater the likelihood of the improper operation. Therefore, as shown in FIG. 13C, the openings in the upper probe plate 1310 can include a countersink portion 1307 to reduce the amount of side load on the probe ends 1309 even if the barrel 1308 is not secured in the opening of the upper probe plate 1310. That is, the thickness of the upper probe plate 1310 contacting the probe end 1309 is reduced. The reduced side load decreases the likelihood of bind and improper operation.

However, the present invention is not limited to countersink openings solely for inserting a barrel portion. In some embodiments, counter sinks can be used when the probe ends are deformed, as illustrated in FIG. 9A. Furthermore, the present invention is not limited to solely a tapered countersink and other countersink designs can also be used with the various embodiments of the present invention.

Using the designs generated in step 1130, the test fixture can then be manufactured in step 1132. In step 1132, the patterns are used to guide the tool creating the openings in the plates. The plates with openings and the necessary probes can then be assembled to provide a test fixture, as previously described. Alternatively, or in combination with step 1132, the test fixture configuration can be provided to the testing system in step 1134. That is, the configuration of contact pads and their associated test points on a particular ECB can be provided to the testing system. Afterwards, the test fixture can be attached to the interface fixture in step 1136, as previously described. The ECB can then be positioned and tested in step 1138. The method can end in step 1140.

In light of the foregoing description of the invention, it should be recognized that the present invention can be realized in hardware, software, or a combination of hardware and software. A method of generating a chaotic sequence according to the present invention can be realized in a centralized fashion in one processing system, or in a distributed fashion where different elements are spread across several interconnected processing systems. Any kind of computer system, or other apparatus adapted for carrying out the methods described herein, is suited. A typical combination of hardware and software could be a general purpose computer processor, with a computer program that, when being loaded and executed, controls the computer processor such that it carries out the methods described herein. Of course, an application specific integrated circuit (ASIC), and/or a field programmable gate array (FPGA) could also be used to achieve a similar result.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form. Additionally, the description above is intended by way of example only and is not intended to limit the present invention in any way, except as set forth in the following claims.

All of the apparatus, methods and algorithms disclosed and claimed herein can be made and executed without undue experimentation in light of the present disclosure. While the invention has been described in terms of preferred embodiments, it will be apparent to those of ordinary skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to one of ordinary skill in the art are deemed to be within the spirit, scope and concept of the invention as defined.

What is claimed is:

1. A system for testing an electronic circuit board (ECB) on a measurement device having a plurality of resources, the ECB having a plurality of test points in a pre-defined arrangement, the system comprising:

an interface fixture having a plurality of contact pads arranged in an array on a first surface, said contact pads being electrically coupled to the plurality of resources of the measurement system according to a pre-defined pattern, wherein at least two of said contact pads are electrically coupled to one of the plurality of resources in a many-to-one relationship; and a test fixture removably attached to said first surface of said interface fixture, comprising:

an upper probe plate having a plurality of openings, and a lower probe plate parallel to said upper probe plate, said lower probe plate having a plurality of openings, and a plurality of probes, each of said probes extending through one of said openings in said upper probe plate and an associated one of said openings in said lower probe plates, each of said probes contacting one of said contact pads, and each of said associated openings guiding each of said plurality of probes to one of said plurality of test points of said ECB.

2. The system of claim 1, wherein at least one of said openings in said lower probe plate is laterally offset with respect to said associated one of said openings in said upper probe plate a first lateral offset distance, said first lateral offset distance at least 0.001 inches.

3. The system of claim 2, wherein a one of said probes extending through said lateral offset one of said openings comprises one or more deformable portions, and wherein said first lateral offset distance is less than or equal to a lateral probe deflection (LPD) distance based on a maximum lateral deflection of said deformable portions.

4. The system of claim 2, wherein said test fixture further comprises:

a plug probe plate parallel to said upper probe plate, said plug probe plate having a plurality of openings associated with said openings in said upper probe plate, said plug plate disposed between said upper probe plate and said lower probe plate, and wherein each of said probes further extends through openings in said plug probe plate.

5. The system of claim 4, wherein at least one of said openings in said plug probe plate is laterally offset a second lateral offset distance with respect to an associated one of said openings in said upper probe plate a second lateral offset distance, said second lateral offset distance at least 0.001 inches and less than or equal to said lateral probe deflection distance.

6. The system of claim 5, wherein said offset ones of said openings in said plug probe plate and said lower probe plate are associated, and wherein said first lateral offset distance is greater than or equal to said second lateral offset distance.

7. The system of claim 5, wherein said offset ones of said openings in said plug probe plate and said lower probe plate are associated, and wherein said first lateral offset distance is less than said second lateral offset distance.

8. The system of claim 1, wherein said pre-defined pattern comprises an alternating "H" pattern.

* * * * *